(12) United States Patent
Beiu (10) Patent No.: US 6,580,296 B1
(45) Date of Patent: Jun. 17, 2003

(54) LOW POWER DIFFERENTIAL CONDUCTANCE-BASED LOGIC GATE AND METHOD OF OPERATION THEREOF

(75) Inventor: Valeriu Beiu, Dallas, TX (US)

(73) Assignee: RN2R, L.L.C., Dallas, TX (US)

( * ) Notice: Subject to any disclaimer, the term of this patent is extended or adjusted under 35 U.S.C. 154(b) by 0 days.

(21) Appl. No.: 09/667,312

(22) Filed: Sep. 22, 2000

(51) Int. Cl.$^7$ .................................................. H03K 19/20
(52) U.S. Cl. ........................................ 326/121; 326/112
(58) Field of Search ................................ 326/121, 104, 326/112, 113, 114, 115, 119, 35, 36

(56) References Cited

U.S. PATENT DOCUMENTS

| | | | |
|---|---|---|---|
| 4,570,084 A | | 2/1986 | Griffin et al. |
| 4,697,109 A | * | 9/1987 | Honma et al. ................ 326/66 |
| 4,883,989 A | * | 11/1989 | Mizukami ..................... 326/86 |
| 4,896,059 A | | 1/1990 | Goodwin-Johansson |
| 5,023,480 A | | 6/1991 | Gleseke et al. |
| 5,426,383 A | * | 6/1995 | Kumar ........................ 326/119 |
| 5,455,528 A | | 10/1995 | Partovi et al. |
| 5,508,640 A | * | 4/1996 | Partovi et al. ................ 326/98 |
| 5,777,491 A | * | 7/1998 | Hwang et al. ............... 326/113 |
| 5,838,166 A | | 11/1998 | Nakamura |
| 5,982,702 A | * | 11/1999 | Bosshart ................ 365/230.06 |
| 5,986,464 A | | 11/1999 | Luck et al. |
| 5,990,709 A | | 11/1999 | Thewes et al. |
| 5,991,789 A | | 11/1999 | Prange et al. |
| 6,002,270 A | | 12/1999 | Timoc |
| 6,014,041 A | | 1/2000 | Somasekhar et al. |
| 6,032,140 A | | 2/2000 | Fabbrizio et al. |
| 6,046,608 A | * | 4/2000 | Theogarajan ................ 326/121 |

OTHER PUBLICATIONS

U.S. patent application Ser. No. 09/562,347, Beiu, Valeriu, filed May 1. 2000.
U.S. patent application Ser. No. 09/407,598, Beiu, Valeriu, filed Sep. 28, 1999.
U.S. patent application Ser. No. 09/406,367, Beiu, Valeriu, filed Sep. 28, 1999.
U.S. patent application Ser. No. 09/392,811, Beiu, Valeriu, filed Sep. 9, 1999.
U.S. patent application Ser. No. 09/158,947, Beiu, Valeriu, filed Sep. 21, 1998.

* cited by examiner

Primary Examiner—Michael Tokar
Assistant Examiner—James H Cho (57) ABSTRACT

A logic gate and methods of operation and manufacturing thereof. In one embodiment, the logic gate comprises complementary first and second computational blocks having first and second sets of binary inputs, respectively. The first computational block develops an output binary digit that is a function of a weighted sum of a first set of input binary digits presented at the first set of binary inputs. The second computational block develops a complementary output binary digit that is a function of a weighted sum of a second set of input binary digits presented at the second set of binary inputs. The logic gate further comprises a cross-coupled differential load, including a first load circuit coupled to the first computational block and driven by the complementary output binary digit, and a second load circuit coupled to the second computational block and driven by the output binary digit.

49 Claims, 8 Drawing Sheets

LOW POWER DIFFERENTIAL CONDUCTANCE-BASED LOGIC GATE AND METHOD OF OPERATION THEREOF

The above-listed applications are commonly assigned with the present invention and are incorporated herein by reference as if reproduced herein in their entirety.

TECHNICAL FIELD OF THE INVENTION

The present invention is directed, in general, to logic gates and, more specifically, to a low power differential logic gate and methods of operation and manufacturing thereof.

BACKGROUND OF THE INVENTION

Digital systems are used extensively in computation and data processing, controls, communications and measurement. Digital systems use digital signals that may only assume discrete values. Typically, digital systems use binary signals that employ only two values. Since such systems only use two distinct values, errors caused by component variations are minimized. As a result, a digital system may be designed such that, for a given input, an output thereof is exactly correct and repeatable. This gives rise to the extreme accuracy for which digital systems are well known.

Analog systems, on the other hand, use analog signals that vary continuously over a specified range. Analog systems are thus particularly vulnerable to error, depending on the accuracy of the components used therein. Since digital systems are generally capable of greater accuracy and reliability than analog systems, many tasks formerly performed by analog systems are now performed exclusively by digital systems.

One basic building block of digital systems is a logic gate. Conventional logic gates have one output and one or more inputs. The number of inputs is called the "fan-in" of the gate. The state of the output is completely determined by the state(s) of the input(s). Conventional logic gates are typically created by coupling a number of transistors together to perform a Boolean function (e.g., AND, OR, NOT). The logic gates are then coupled together to form a multi-layer circuit that is capable of performing logical functions (e.g., arithmetic functions).

Increasing processing power is a continuing goal in the development of processors such as microprocessors or digital signal processors (DSPs). Processor designers are generally familiar with three ways to increase the processing power of a central processing unit (CPU). The CPU's clock frequency may be increased so that the CPU can perform a greater number of operations in a given time period. Processors are designed to operate at increasingly high clock frequencies. While a higher clock frequency generally results in increased processing power, the higher clock frequency also increases power dissipation, resulting in higher device operating temperatures. Processor designers, therefore, must address these additional problems to avoid catastrophic device failures.

Another way to increase processing power is to increase input and output data bus width, thereby allowing the CPU to process a greater amount of code and data. Early processors were packaged using dual in-line packaging (DIP) technology. Increasing the width of the data buses was both expensive and unrealistic, often resulting in extremely large device packages. Today, with the use of pin grid array (PGA) packaging, increasing the size of the data buses no longer poses a packaging problem. Of course, a larger number of transistors is required to process the additional information conveyed by the wider data buses, which translates into increased power dissipation by the processor.

Yet another way to increase processing power is to change the internal architecture of the processor to overlap the execution of instructions by, for example, superscaling. This method also requires the addition of a large number of transistors, since entire processing stages or execution units must be duplicated. Performing a large number of instructions in parallel may also result in data dependency problems. Further, the additional transistors also increase power dissipation.

With the rise of portable and personal computing, power dissipation has become an important factor in the design of processors. Processors employed in desktop or server-based applications may be designed to maximize speed with little regard for power consumption. Processors employed in laptop, palmtop or other portable devices, however, must be designed with power consumption in mind due to the often limited capabilities of the batteries powering the portable devices. Since the processor includes a large number of logic gates, reducing power dissipation in the individual logic gates can accordingly reduce the power consumption of the processor as a whole.

Accordingly, what is needed in the art is a logic gate operable at high frequency that overcomes the disadvantages of prior art logic gates.

SUMMARY OF THE INVENTION

To address the above-discussed deficiencies of the prior art, the present invention provides a logic gate and methods of operation and manufacturing thereof. In one embodiment, the logic gate comprises complementary first and second computational blocks having first and second sets of binary inputs, respectively. The first computational block develops an output binary digit that is a function of a weighted sum of a first set of input binary digits presented at the first set of binary inputs. The second computational block develops a complementary output binary digit that is a function of a weighted sum of a second set of input binary digits presented at the second set of binary inputs. The logic gate further comprises a cross-coupled differential load. The cross-coupled differential load includes a first load circuit coupled to the first computational block and driven by the complementary output binary digit. The cross-coupled differential load further includes a second load circuit coupled to the second computational block and driven by the output binary digit.

The present invention therefore introduces the broad concept of employing complementary computational blocks to compute complementary output binary digits. The complementary output binary digits are employed to control the load circuits to accelerate a pace at which the complementary output binary digits transition from state to state.

In one embodiment of the present invention, the cross-coupled differential load cooperates with the first and second computational blocks to increase a noise tolerance of the logic gate. The cross-coupled differential load reduces the need for additional noise suppression circuitry (see, e.g., the '367 application), thereby reducing a number of transistors required to implement the logic gate.

In one embodiment of the present invention, the logic gate computes the output binary digit and the complementary output binary digit without employing a timing signal. While some logic gates of the prior art required a timing signal to synchronize the operation of the logic gate, the logic gate of the present invention is capable of operating asynchronously.

In one embodiment of the present invention, the first load circuit cooperates with the first computational block to implement a first threshold function. The output binary digit may thus be further a function of the first threshold function. In a related embodiment, the second load circuit cooperates with the second computational block to implement a second threshold function. The complementary output binary digit may further be a function of the second threshold function.

In one embodiment of the present invention, the first load circuit comprises a first transistor and the second load circuit comprises a second transistor. The first and second transistors may be sized proportional to $\theta$ and $\theta-1$, respectively.

In one embodiment of the present invention, the first and second computational blocks employ identical topologies, thus simplifying design of the overall logic gate.

In one embodiment of the present invention, ones of the second set of input binary digits are inverses of corresponding ones of the first set of input binary digits. In an alternative embodiment, ones of the second set of input binary digits are identical to corresponding ones of the first set of input binary digits. Whether the ones of the second set of input binary digits are inverses or identical to the ones of the first set of input binary digits depend on the polarities of the transistors employed in the first and second computational blocks.

In one embodiment of the present invention, the first and second computational blocks comprise n-channel metal oxide semiconductor (NMOS) transistors, each of the first and second load circuits comprising a p-channel metal oxide semiconductor (PMOS) transistor. In an alternative embodiment, the first and second computational blocks comprise PMOS transistors, each of the first and second load circuits comprising an NMOS transistor. In either case, the drive signals to the first and second load circuits may be taken directly from the second and first computational blocks. In another alternative embodiment, the first and second computational blocks comprise one polarity of MOS transistors (whether NMOS or PMOS), each of the first and second load circuits comprising an identical polarity of MOS transistor and an inverter. The inverters are used to invert the output binary digit and the complementary output binary digit before application to the first and second load circuits.

In one embodiment of the present invention, both the first and second computational blocks comprise NMOS transistors, ones of the second set of input binary digits being inverses of corresponding ones of the first set of input binary digits. In another embodiment, the first computational block comprises NMOS transistors while the second computational block comprises PMOS transistors. Ones of the second set of input binary digits are therefore identical to corresponding ones of the first set of input binary digits.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
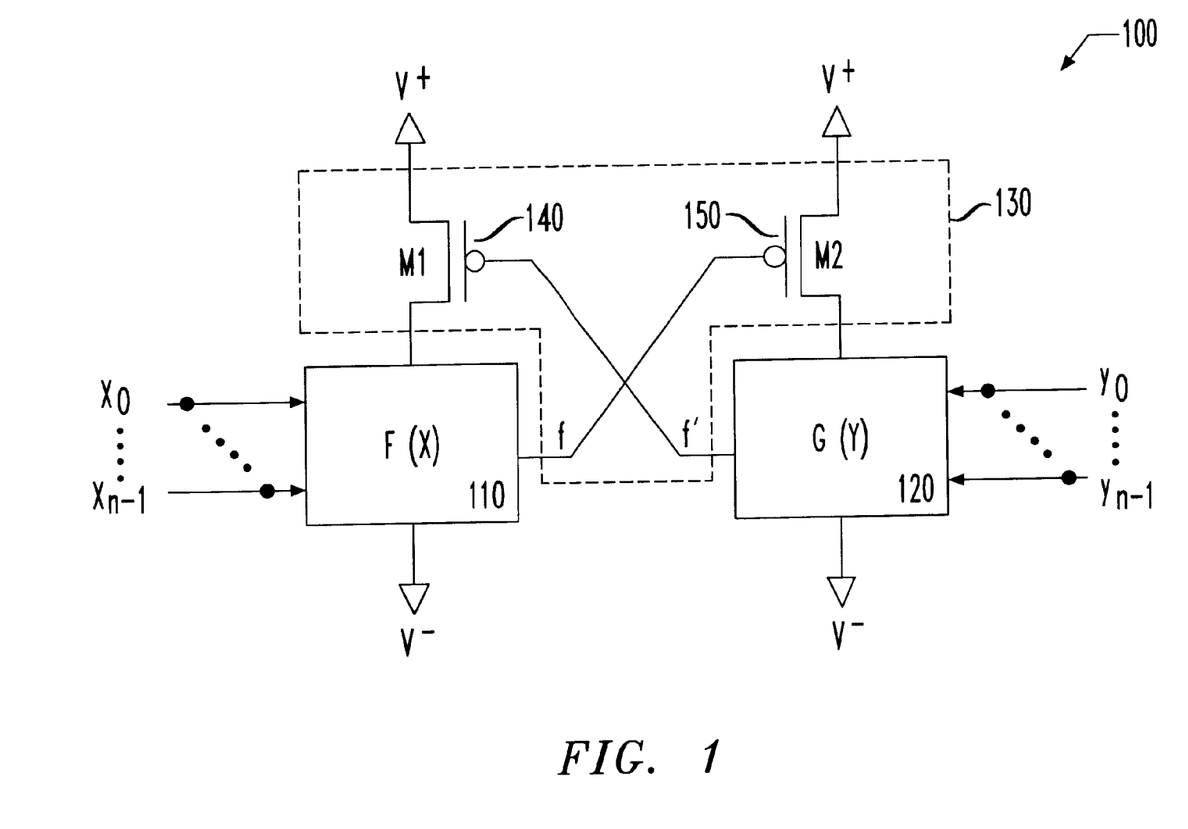
FIG. 1 illustrates a simplified schematic diagram of an embodiment of a logic gate constructed in accordance with the principles of the present invention.

Referring initially to FIG. 1, illustrated is a simplified schematic diagram of an embodiment of a logic gate 100 constructed in accordance with the principles of the present invention. The logic gate 100 includes a first computational block 110 having a plurality of binary inputs $x_0, \ldots, x_{n-1}$ (first set of binary inputs). The logic gate 100 further includes a second computational block 120 having a plurality of binary inputs $y_0, y_{n-1}$ (second set of binary inputs). The logic gate 100 still further includes a cross-coupled differential load 130 coupled to the first and second computational blocks 110, 120. The cross-coupled differential load 130 includes a first load circuit 140 coupled to the first computational block 110. The cross-coupled differential load 130 further includes a second load circuit 150 coupled to the second computational block 120.

In the illustrated embodiment, the first load circuit 140 includes a first load p-channel metal oxide semiconductor (PMOS) transistor M1 coupled between the first computational block 110 and a positive voltage source V$^+$ (e.g., VDD). The first computational block 110 is further coupled to a negative voltage source V$^-$ (e.g., GND). The second load circuit 150 includes a second load PMOS transistor M2 coupled between the second computational block 120 and the positive voltage source V$^+$. The second computational block 120 is further coupled to the negative voltage source V$^-$.

The first and second computational blocks 110, 120 are complementary computational blocks in that the first computational block 110, in conjunction with the first load circuit 140, is configured to develop an output binary digit f, while the second computational block 120, in conjunction with the second load circuit 150, is configured to develop a complementary output binary digit f' (which is an inverse of the output binary digit f). The output binary digit f is then employed to drive a control terminal of the second load circuit 150, while the complementary output binary digit f' is employed to drive a control terminal of the first load circuit 140. In the illustrated embodiment, the output binary digit f is coupled to a gate terminal of the second load PMOS transistor M2. The complementary output binary digit f' is coupled to a gate terminal of the first load PMOS transistor M1. The first and second load circuits 140, 150 thus form the cross-coupled differential load 130.

In the illustrated embodiment, the first set of binary inputs $x_0, \ldots, x_{n-1}$, has a corresponding first set of discrete weights $w_0, \ldots, w_{n-1}$ associated therewith. The output binary digit f is, therefore, a function of a weighted sum of a first set of input binary digits presented at the first set of binary inputs $x_0, \ldots, x_{n-1}$. The output binary digit f is further a function of a first threshold value $\Theta(M1)$.

The second set of binary inputs $y_0, \ldots, y_{n-1}$, likewise, has a corresponding second set of discrete weights $v_0, \ldots, v_{n-1}$ associated therewith. The complementary output binary digit f' is, therefore, a function of a weighted sum of a second set of input binary digits presented at the second set of binary inputs $y_0, \ldots, y_{n-1}$. The complementary output binary digit f' is further a function of a second threshold value $\Theta(M2)$.

The output binary digit f and the complementary output binary digit f' may be represented by the following equations.

$$f = \operatorname{sgn}[F(X) - \Theta(M1)] \quad (1)$$

$$f' = \operatorname{sgn}[G(Y) - \Theta(M2)] \quad (2)$$

The functions F(X) and G(Y) performed by the first and second computational blocks, respectively, may be represented by the following equations.

$$F(X) = \Sigma w_i x_i \quad (3)$$

$$G(Y) = \Sigma v_i y_i \quad (4)$$

The relationship between the first and second threshold values $\Theta(M1)$, $\Theta(M2)$ may be represented by the following equation.

$$\Theta(M1) - \Theta(M2) = 1 \quad (5)$$

While equation (5) presents the difference between the first and second threshold values $\Theta(M1)$, $\Theta(M2)$ as an integer for simplicity, the difference may be any value between 0.5 and 1.5.

The logic gate 100 operates as follows. The first computational block 110 computes a weighted sum of the first set of input binary digits presented at the first set of binary inputs $x_0, \ldots, x_{n-1}$. The weighted sum is then compared to (balanced with) the first threshold value $\Theta(M1)$ presented to the first computational block 110 by the first load circuit 140 to develop the output binary digit f.

The second computational block 120 computes a weighted sum of the second set of input binary digits presented at the second set of binary inputs $y_0, \ldots, y_{n-1}$. The weighted sum is then compared to the second threshold value $\Theta(M2)$ presented to the second computational block 120 by the second load circuit 150 to develop the complementary output binary digit f'. The output binary digit f is then applied to the control terminal of the second load circuit 150, while the complementary output binary digit f' is applied to the control terminal of the first load circuit 140.

The operation of the logic gate 100 will now be described with respect to various state transitions. Assume, for example, that the logic gate 100 is initially in a state wherein the output binary digit f is low and the complementary output binary digit f' is high (i.e., f=0, f'=1). The first load PMOS transistor M1, which is driven by the complementary output binary digit f', is OFF, while the second load PMOS transistor M2, which is driven by the output binary digit f, is ON.

In a first branch circuit formed by the first load PMOS transistor M1 and the first computational block 110, the OFF state of the first load PMOS transistor M1 effectively decouples the first computational block 110 from the positive voltage source $V^+$. In a second branch circuit formed by the second load PMOS transistor M2 and the second computational block 120, the second load PMOS transistor M2 exerts a pull-up force, while the second computational block 120 exerts a pull-down force. Because the complementary output binary digit f' is high, it follows from equations (2) and (4) that the following relationship exists.

$$\Sigma v_i y_i > \Theta(M2) \quad (6)$$

Thus, the second computational block 120 is not exerting enough pull-down force to counteract the pull-up force exerted by the second load PMOS transistor M2.

Now, assume that the first and second sets of input binary digits presented at the first and second sets of binary inputs $x_0, \ldots, x_{n-1}, y_0, \ldots, y_{n-1}$, respectively, are changing such that logic gate 100 may transition to a state wherein the output binary digit f is high and the complementary output binary digit f' is low (i.e., f=1, f'=0). Any change in the input binary digits cannot yet modify a value of the output binary digit f as the first load PMOS transistor M1 is OFF. Because the complementary output binary digit f' should be low for the new sets of input binary digits, the second computational block 120 now exerts a pull-down force capable of counteracting the pull-up force exerted by the second load PMOS transistor M2. A voltage of the complementary output binary digit f' thus decreases.

Since the complementary output binary digit f' is coupled to the control terminal of the first load PMOS transistor M1, the decreasing voltage of the complementary output binary digit f' will cause the first load PMOS transistor M1 to start turning ON. As the first load PMOS transistor M1 turns ON, it will begin to exert a pull-up force in the first branch circuit. Because the output binary digit f should be high, the pull-up force exerted by the first load PMOS transistor M1 will exceed the pull-down force exerted by the first computational block 110. This results in an increase in a voltage of the output binary digit f, which starts to turn OFF the second load PMOS transistor M2, accelerating the pace at which the voltage of the complementary output binary digit f' decreases toward the negative voltage source $V^-$.

The logic gate 100 ultimately settles in the state wherein the first load PMOS transistor M1 is ON, the second load PMOS transistor M2 if OFF, the output binary digit f is high, and the complementary output binary digit f' is low (i.e., f=1, f'=0). Because the output binary digit f is high, it follows from equations (1) and (3) that the following relationship exists.

$$\Sigma w_i x_i > \Theta(M1) \quad (7)$$

Thus, the first computational block 110 is not exerting enough pull-down force to counteract the pull-up force exerted by the first load PMOS transistor M1.

Now, assume that the first and second sets of input binary digits are changing such that logic gate 100 may transition to a state wherein the output binary digit f is low and the complementary output binary digit f' is high (i.e., f=0, f'=1). Any change in the input binary digits cannot yet modify the value of the complementary output binary digit f' as the second load PMOS transistor M2 is OFF. Because the output binary digit f should be low for the new sets of input binary digits, the first computational block 110 now exerts a pull-down force capable of counteracting the pull-up force exerted by the first load PMOS transistor M1. A voltage of the output binary digit f thus decreases.

Since the output binary digit f is coupled to the control terminal of the second load PMOS transistor M2, the decreasing voltage of the output binary digit f will cause the second load PMOS transistor M2 to start turning ON. As the second load PMOS transistor M2 turns ON, it will begin to exert a pull-up force in the second branch circuit. Because the complementary output binary digit f' should be high, the pull-up force exerted by the second load PMOS transistor M2 will exceed the pull-down force exerted by the second computational block 120. This results in an increase in a voltage of the complementary output binary digit f', which starts to turn OFF the first load PMOS transistor M1, accelerating the pace at which the voltage of the output binary digit f decreases toward the negative voltage source $V^-$. The logic gate 100 ultimately settles in the state wherein the first load PMOS transistor M1 is OFF, the second load PMOS transistor M2 if ON, the output binary digit f is low, and the complementary output binary digit f' is high (i.e., f=0, f'=1).

Figure 2:
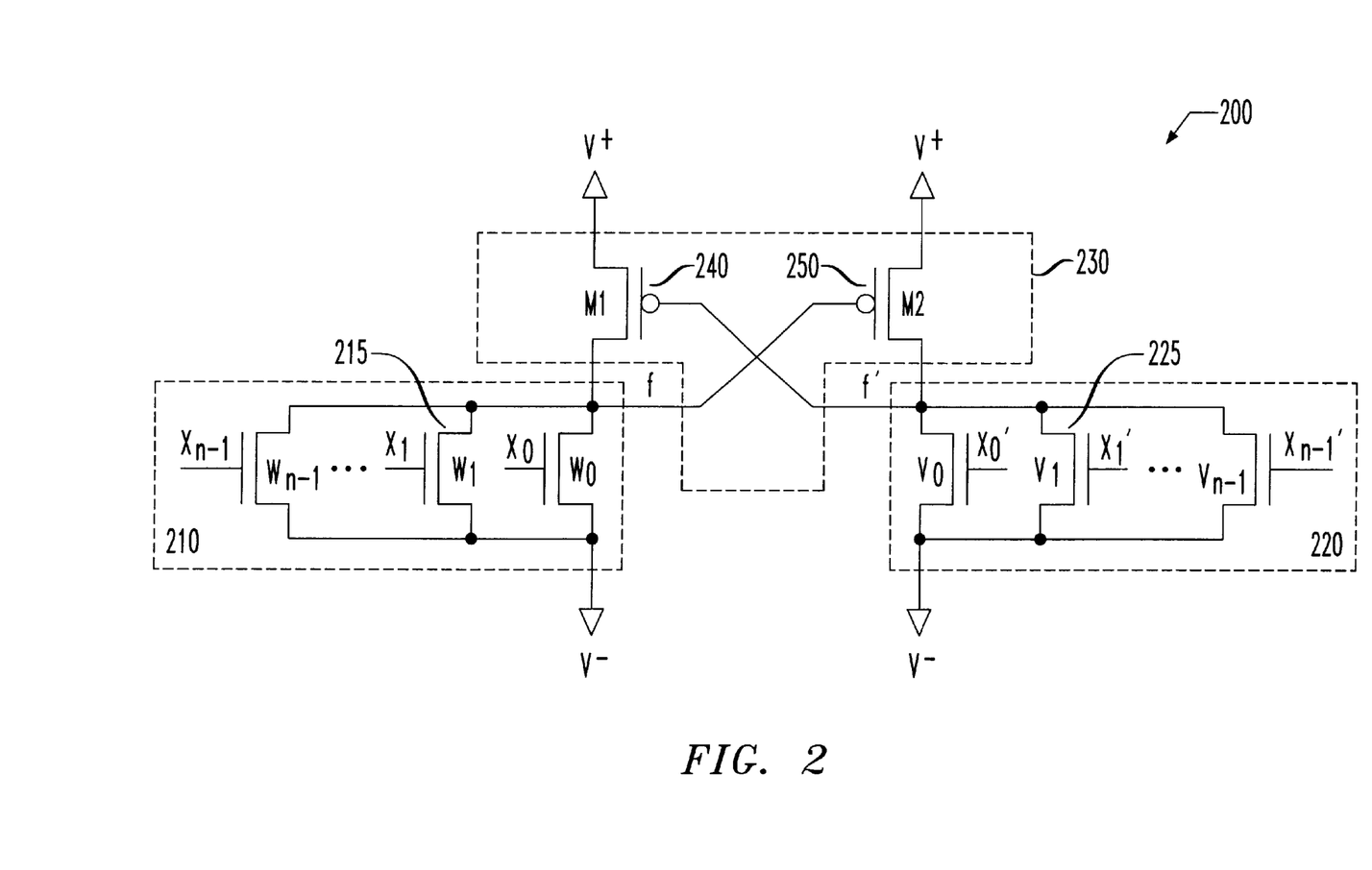
FIG. 2 illustrates a schematic diagram of an embodiment of a logic gate constructed in accordance with the principles of the present invention.

Turning now to FIG. 2, illustrated is a schematic diagram of an embodiment of a logic gate 200 constructed in accordance with the principles of the present invention. The logic gate 200 includes complementary first and second computational blocks 210, 220. The logic gate 200 further includes a cross-coupled differential load 230 coupled to the complementary first and second computational blocks 210, 220. The cross-coupled differential load 230 includes a first load circuit 240 coupled to the first computational block 210 and a second load circuit 250 coupled to the second computational block 220.

In the illustrated embodiment, the first computational block 210 has a number of binary inputs (first set of binary inputs) configured to receive a corresponding number of input binary digits (first set of input binary digits) $x_0, x_1, \ldots, x_{n-1}$. The first set of binary inputs include a first set of parallel-coupled metal oxide semiconductor (MOS) transistors (one of which is designated 215). The first set of input binary digits $x_0, x_1, \ldots, x_{n-1}$ are applied to gates of the MOS transistors 215. In the illustrated embodiment, the MOS transistors 215 are n-channel MOS (NMOS) transistors coupled to a negative voltage $V^-$ (e.g., GND). Of course, in other embodiments, the MOS transistors 215 may be p-channel MOS (PMOS) transistors.

The second computational block 220 has a number of binary inputs (second set of binary inputs) configured to receive a corresponding number of input binary digits (second set of input binary digits) $x_0', x_1', \ldots, x_{n-1}'$. In the illustrated embodiment, ones of the second set of input binary digits $x_0', x_1', \ldots, x_{n-1}'$ are inverses of corresponding ones of the first set of input binary digits $x_0, x_1, \ldots, x_{n-1}$. The second set of binary inputs include a second set of parallel-coupled MOS transistors (one of which is designated 225). The second set of input binary digits $x_0', x_1', \ldots, x_{n-1}'$ are applied to gates of the MOS transistors 225. In the illustrated embodiment, the MOS transistors 225 are NMOS transistors coupled to the negative voltage $V^-$. Of course, in other embodiments, the MOS transistors 215 may be PMOS transistors.

In the illustrated embodiment, wherein the first and second computational blocks 210, 220 employ NMOS transistors, the first load circuit 240 includes a first load PMOS transistor M1 coupled between the first computational block 210 and a positive voltage $V^+$ (e.g., VDD). The second load circuit 250 includes a second load PMOS transistor M2 coupled between the second computational block 220 and the positive voltage $V^+$.

Since MOS transistors have an intrinsic on-state conductance, the present invention selects lengths and widths of the channels of each of the first and second set of MOS transistors 215, 225 such that the intrinsic conductance of each of the MOS transistors 215, 225 corresponds to a desired discrete weight. In the illustrated embodiment, the first set of MOS transistors 215 have weights of $w_0, w_1, \ldots, w_{n-1}$, respectively, while second set of MOS transistors 225 have weights of $v_0, v_1, \ldots, v_{n-1}$, respectively. The functions F(X) and G(Y) performed by the first and second computational blocks 210, 220 may be represented by equations (3) and (4) respectively.

The length and width of the channels of the first and second load PMOS transistors M1, M2 are selected such that the first and second load PMOS transistors M1, M2 may present desired threshold values of $\Theta(M1)$, $\Theta(M2)$ to the first and second computational blocks 210, 220, respectively. In the illustrated embodiment, the first and second load PMOS transistors M1, M2 are sized proportional to $\Theta$ and $\Theta-1$, respectively, in accordance with equation (5). The first load PMOS transistor M1 thus presents a threshold value of $\Theta$ to the first computational block 210, while the second load PMOS transistor M2 presents a threshold value of $\Theta-1$ to the second computational block 220.

The first computational block 210 cooperates with the first load circuit 240 to develop an output binary digit f, which may be represented by equation (1). The second computational block 220 cooperates with the second load circuit 250 to develop a complementary output binary digit f', which may be represented by equation (2). The output binary digit f is applied to a control terminal of the second load circuit 250 (e.g., a gate terminal of the second load PMOS transistor M2). The complementary output binary digit f' is applied to a control terminal of the first load circuit 240 (e.g., a gate terminal of the first load PMOS transistor M1). The first and second load circuits 240, 250 are thus cross-coupled to the first and second computational blocks 210, 220. The operation of the logic gate 200 is analogous to the operation of the logic gate 100 illustrated and described with respect to FIG. 1.

Figure 3:
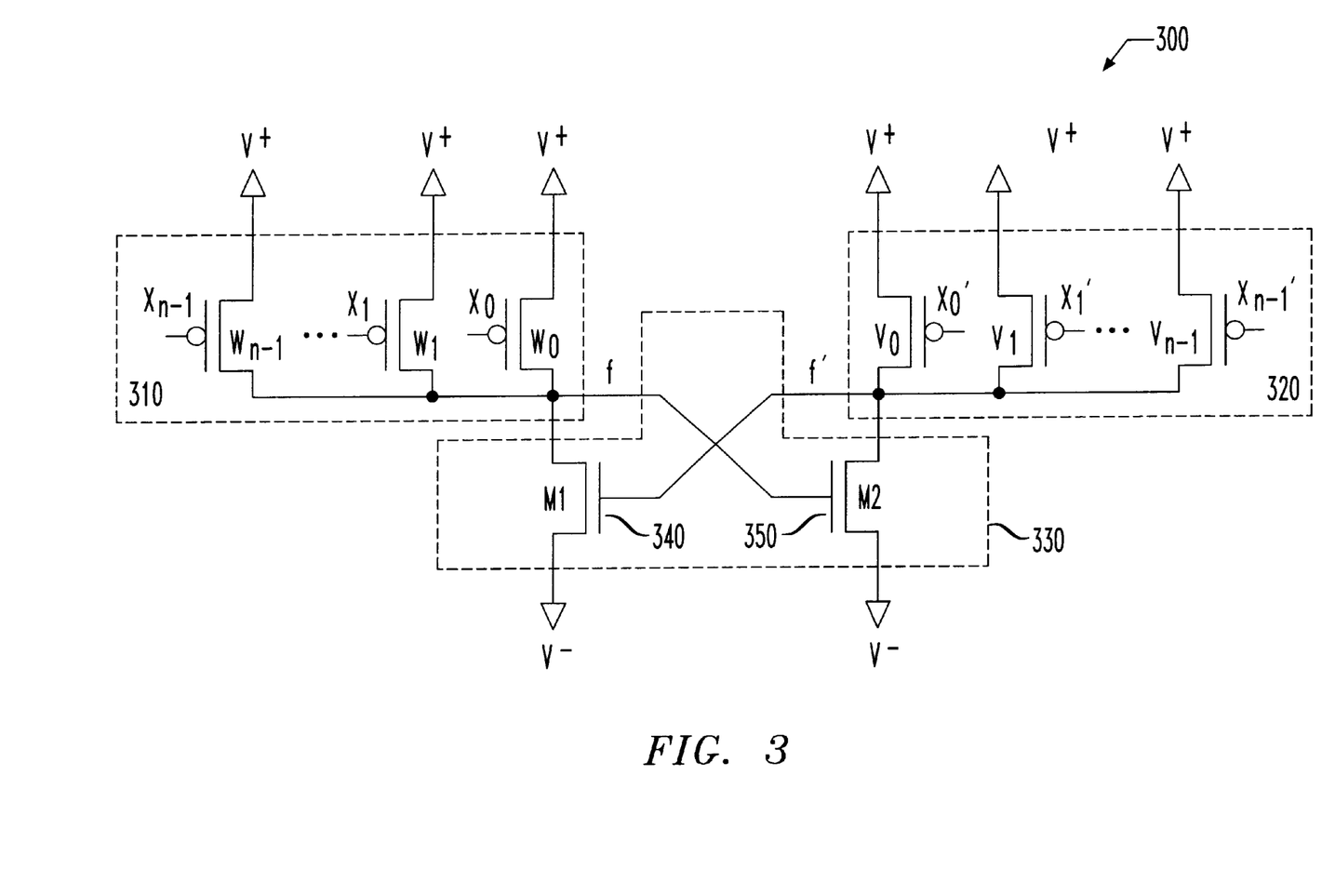
FIG. 3 illustrates a schematic diagram of another embodiment of a logic gate constructed in accordance with the principles of the present invention.

Turning now to FIG. 3, illustrated is a schematic diagram of another embodiment of a logic gate 300 constructed in accordance with the principles of the present invention. The logic gate 300 includes complementary first and second computational blocks 310, 320. The logic gate 300 further includes a cross-coupled differential load 330 coupled to the complementary first and second computational blocks 310, 320. The cross-coupled differential load 330 includes a first load circuit 340 coupled to the first computational block 310 and a second load circuit 350 coupled to the second computational block 320.

While the first and second computational blocks 210, 220 of FIG. 2 employ NMOS transistors coupled to the negative voltage $V^-$, the first and second computational blocks 310, 320 employ PMOS transistors coupled to the positive voltage $V^+$. The first load circuit 340 includes a first load NMOS transistor M1 coupled between the first computational block 310 and a negative voltage $V^-$. The second load circuit 350 includes a second load NMOS transistor M2 coupled between the second computational block 320 and the negative voltage $V^-$.

Analogous to the first and second computational blocks 210, 220 of FIG. 2, the first and second computational blocks 310, 320 employ identical polarities of MOS transistors. Ones of a first set of input binary digits to the MOS transistors of the first computational block 310 are therefore inverses of corresponding ones of a second set of input binary digits to the MOS transistors of the second computational block 320.

The first computational block 310 cooperates with the first load circuit 340 to develop an output binary digit f, while the second computational block 320 cooperates with the second load circuit 350 to develop a complementary output binary digit f'. The output binary digit f is applied to a control terminal of the second load circuit 350 (e.g., a gate terminal of the second load NMOS transistor M2). The complementary output binary digit f' is applied to a control terminal of the first load circuit 340 (e.g., a gate terminal of the first load NMOS transistor M1). The first and second load circuits 340, 350 are thus cross-coupled to the first and second computational blocks 310, 320. The operation of the logic gate 300 is analogous to the operation of the logic gate 100 illustrated and described with respect to FIG. 1.

Figure 4:
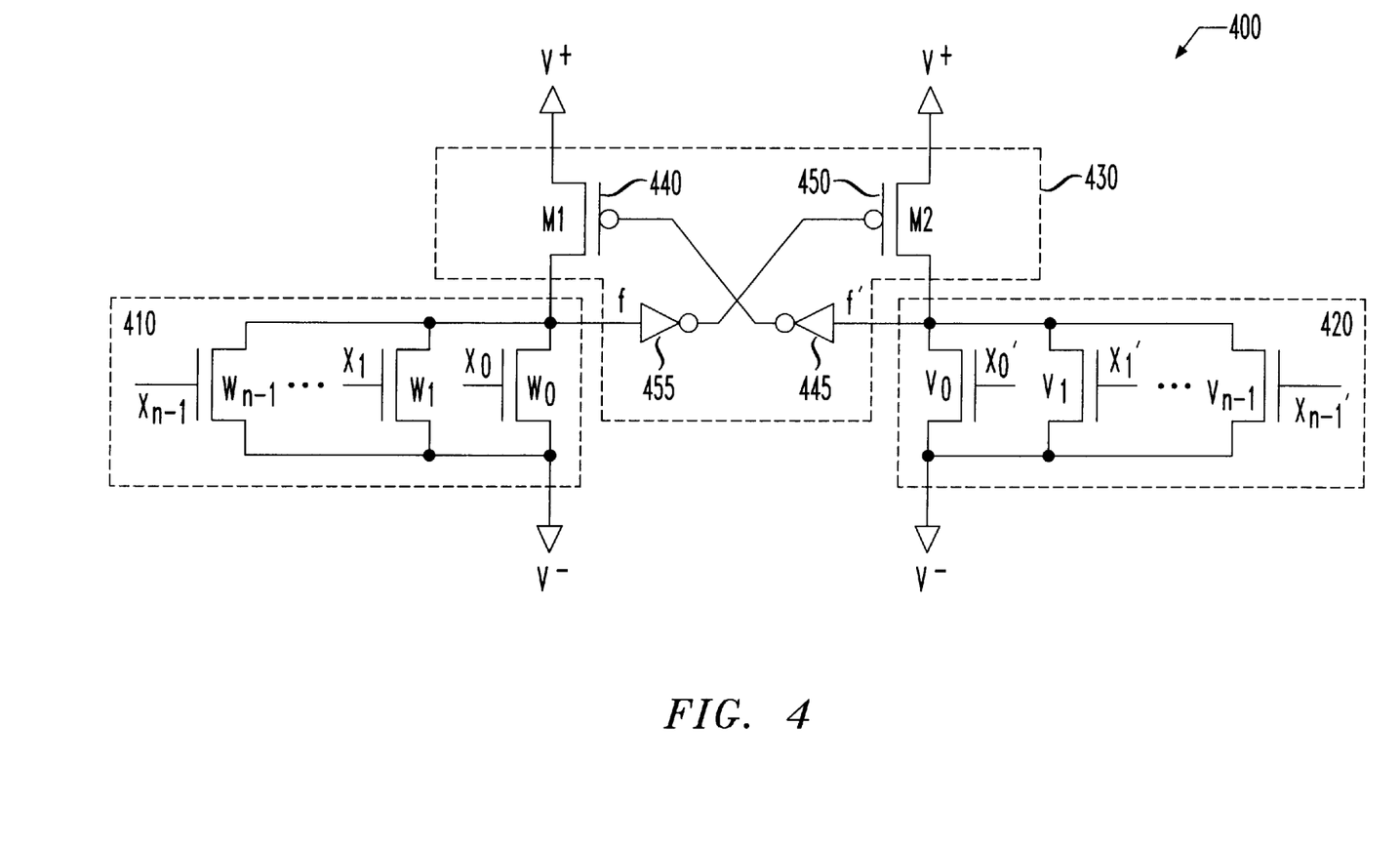
FIG. 4 illustrates a schematic diagram of another embodiment of a logic gate constructed in accordance with the principles of the present invention.

Turning now to FIG. 4, illustrated is a schematic diagram of another embodiment of a logic gate 400 constructed in accordance with the principles of the present invention. The logic gate 400 includes complementary first and second computational blocks 410, 420, employing parallel-coupled NMOS transistors coupled to the negative voltage V⁻. The logic gate 400 further includes a cross-coupled differential load 430 coupled to the complementary first and second computational blocks 410, 420. The cross-coupled differential load 430 includes a first load circuit 440 coupled to the first computational block 410 and a second load circuit 450 coupled to the second computational block 420.

While the logic gate 200 of FIG. 2 employs NMOS first and second computational blocks 210, 220 cross-coupled to PMOS first and second load circuits 240, 250, and the logic gate 300 of FIG. 3 employs PMOS first and second computational blocks 310, 320 cross-coupled to NMOS first and second load circuits 340, 350, the logic gate 400 employs NMOS first and second computational blocks 410, 420 cross-coupled to NMOS first and second load circuits 440, 450. The first and second computational blocks 410, 420 and the first and second load circuits 440, 450 thus employ identical polarities of MOS transistors. The second computational block 420 is therefore coupled to the first load circuit 440 via a first inverter 445 while the first computational block 410 is coupled to the second load circuit 430 via a second inverter 455.

The first computational block 410 cooperates with the first load circuit 440 to develop an output binary digit f, while the second computational block 420 cooperates with the second load circuit 450 to develop a complementary output binary digit f'. The output binary digit f is applied to the control terminal of the second load circuit 450 via the second inverter 455 while the complementary output binary digit f' is applied to a control terminal of the first load circuit 440 via the first inverter 445. The first and second load circuits 440, 450 are thus cross-coupled to the first and second computational blocks 410, 420. The operation of the logic gate 400 is analogous to the operation of the logic gate 100 illustrated and described with respect to FIG. 1.

Figure 5:
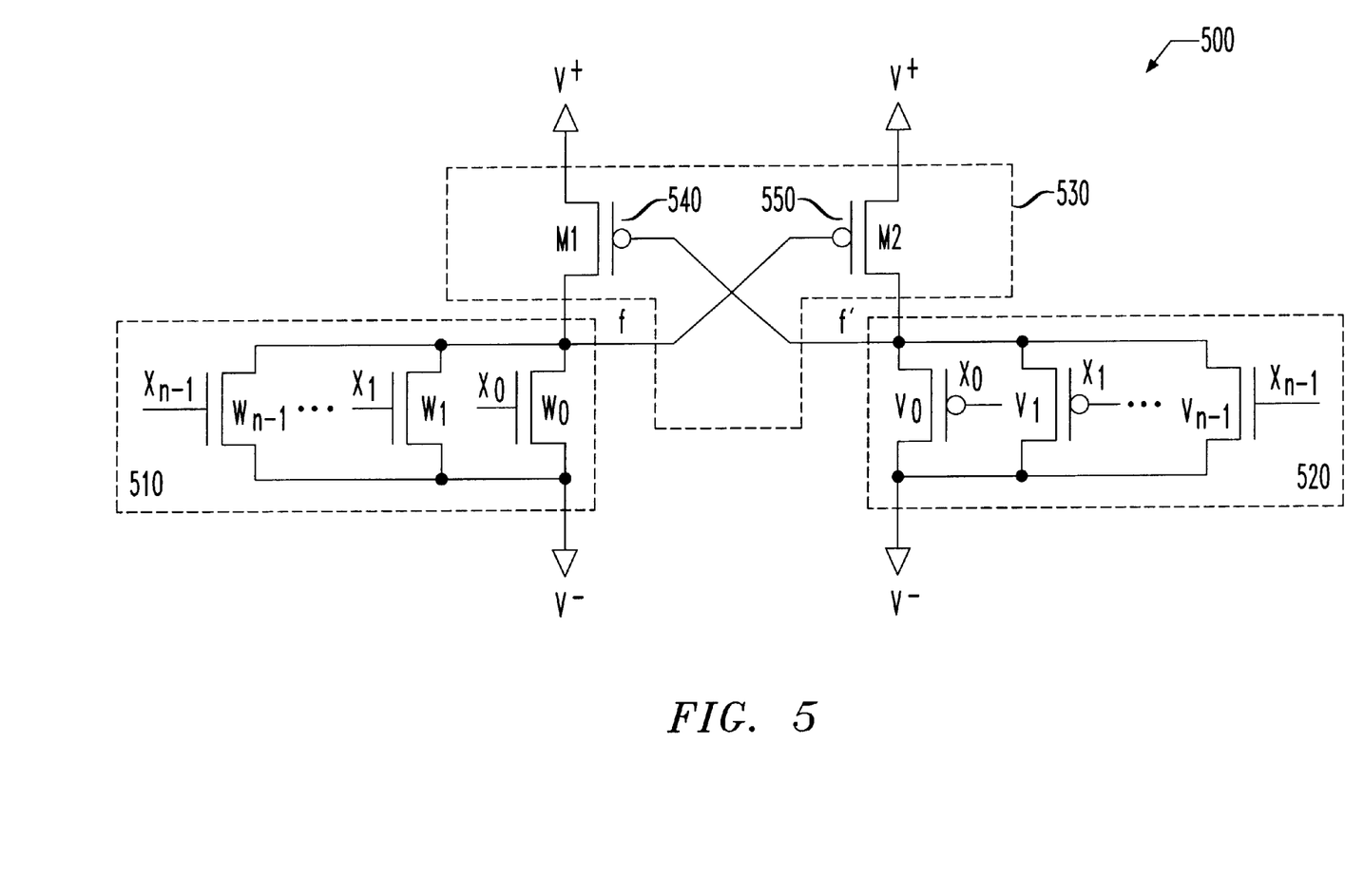
FIG. 5 illustrates a schematic diagram of another embodiment of a logic gate constructed in accordance with the principles of the present invention.

Turning now to FIG. 5, illustrated is a schematic diagram of another embodiment of a logic gate 500 constructed in accordance with the principles of the present invention. The logic gate 500 includes complementary first and second computational blocks 510, 520 and a cross-coupled differential load 530 coupled thereto. The cross-coupled differential load 530 includes first and second load circuits 540, 550 coupled to the first and second computational blocks 510, 520, respectively.

While the first and second computational blocks 210, 220 of FIG. 2 both employ NMOS transistors, and the first and second computational blocks 310, 320 of FIG. 3 both employ PMOS transistors, the first and second computational blocks 510, 520 employ opposing polarities of MOS transistors. More specifically, the first computational block 510 employ NMOS transistors, while the second computational block 520 employ PMOS transistors. Ones of a first set of input binary digits applied to the first computational block 510 are, therefore, identical to ones of a second set of input binary digits applied to the second computational block 520.

The first load circuit 540 includes a first load PMOS transistor M1 coupled between the first computational block 510 and the positive voltage V⁺. The second load circuit 550 includes a second load PMOS transistor M2 coupled between the second computational block 520 and the positive voltage V⁺.

The first computational block 510 cooperates with the first load circuit 540 to develop an output binary digit f, which is applied to a control terminal of the second load circuit 550, while the second computational block 520 cooperates with the second load circuit 550 to develop a complementary output binary digit f', which is applied to a control terminal of the first load circuit 540. The first and second load circuits 540, 550 are thus cross-coupled to the first and second computational blocks 510, 520. The operation of the logic gate 500 is analogous to the operation of the logic gate 100 illustrated and described with respect to FIG. 1.

Figure 6:
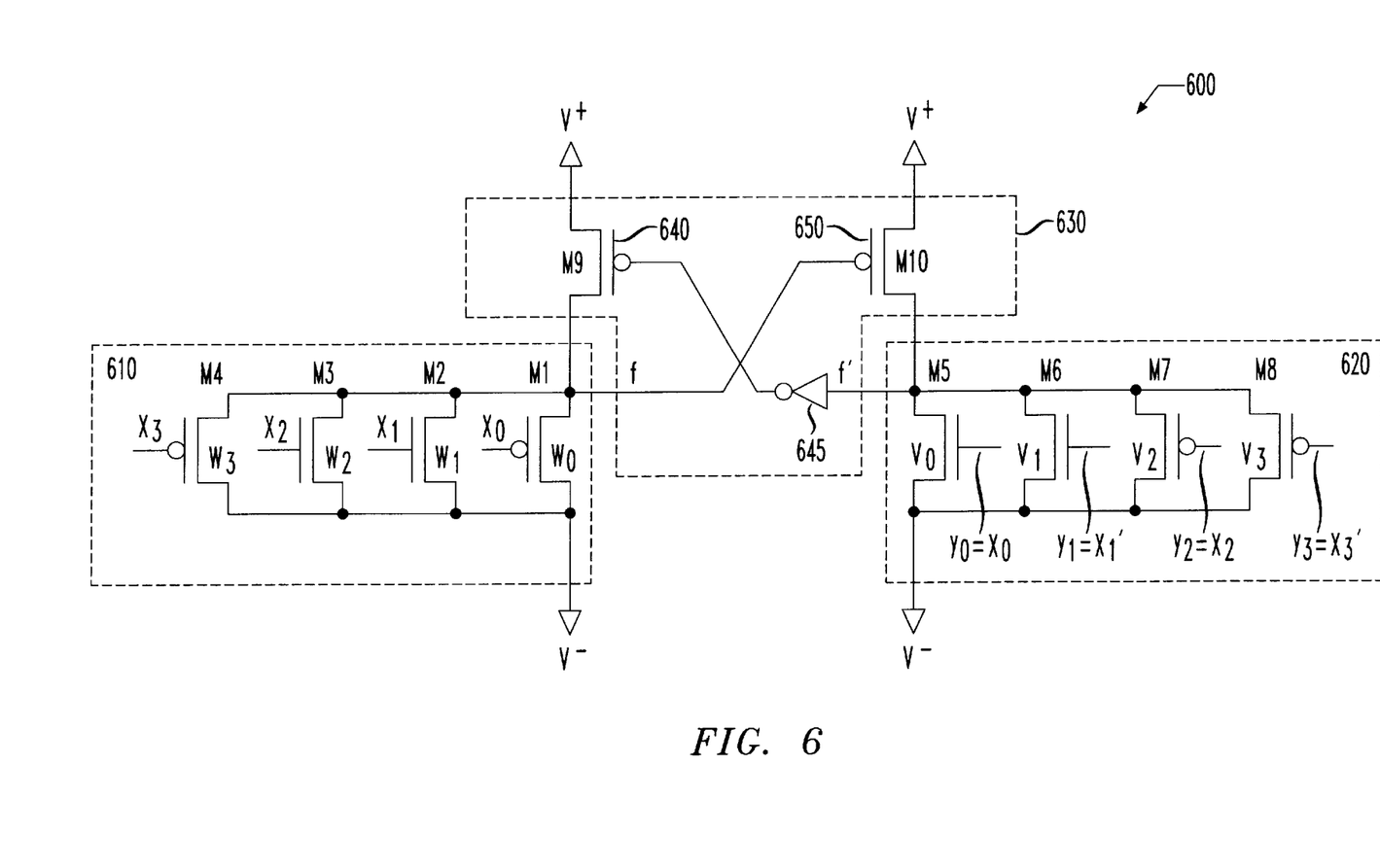
FIG. 6 illustrates a schematic diagram of another embodiment of a logic gate constructed in accordance with the principles of the present invention.

Turning now to FIG. 6, illustrated is a schematic diagram of another embodiment of a logic gate 600 constructed in accordance with the principles of the present invention. The logic gate 600 includes complementary first and second computational blocks 610, 620, employing parallel-coupled MOS transistors coupled to a negative voltage V⁻. The logic gate 600 further includes a cross-coupled differential load 630 coupled to the complementary first and second computational blocks 610, 620. The cross-coupled differential load 630 includes a first load circuit 640 coupled to the first computational block 610 and a second load circuit 650 coupled to the second computational block 620.

While the logic gate 200 of FIG. 2 employs NMOS first and second computational blocks 210, 220, and the logic gate 500 of FIG. 5 employs an NMOS first computational block 510 and a PMOS second computational block 520, each of the computational blocks need not employ only one polarity of MOS transistors. In the illustrated embodiment, the first and second computational blocks 610, 620 each employ both NMOS and PMOS transistors.

The first computational block 610 includes first, second, third and fourth MOS transistors M1, M2, M3, M4 respectively configured to receive a first set of input binary digits $x_0, x_1, x_2, x_3$. The second computational block 620 includes fifth, sixth, seventh and eighth MOS transistors M5, M6, M7, M8 respectively configured to receive a second set of input binary digits $y_0, y_1, y_2, y_3$. In the illustrated embodiment, the first, fourth, seventh and eighth MOS transistors M1, M4, M7, M8 are PMOS transistors while the second, third, fifth and sixth MOS transistors M2, M3, M5, M6 are NMOS transistors. A relationship between the first set of input binary digits $x_0, x_1, x_2, x_3$ and the second set of input binary digits $y_0, y_1, y_2, y_3$ may be represented by the following equations.

$$y_0 = x_0 \tag{8}$$

$$y_1 = x_1' \tag{9}$$

$$y_2 = x_2 \tag{10}$$

$$y_3 = x_3' \tag{11}$$

Those skilled in the pertinent art will realize that various logical combinations of transistors and input binary digits may be employed in the first and second computational blocks 610, 620 and are well within the scope of the present invention.

In the illustrated embodiment, the first load circuit 640 includes an NMOS transistor M9 while the second load circuit 650 includes a PMOS transistor M10. The first computational block 610 is directly coupled to the second load circuit 650 while the second computational block 620 is coupled to the first load circuit 640 via an inverter 645.

The first computational block 610 cooperates with the first load circuit 640 to develop an output binary digit f, while the second computational block 620 cooperates with the second load circuit 650 to develop a complementary output binary digit f'. The output binary digit f is applied to the control terminal of the second load circuit 650 (without necessitating an inverter) while the complementary output binary digit f' is applied to a control terminal of the first load circuit 640 via the inverter 645. The first and second load circuits 640, 650 are thus cross-coupled to the first and second computational blocks 610, 620. The operation of the logic gate 600 is analogous to the operation of the logic gate 100 illustrated and described with respect to FIG. 1.

Figure 7:
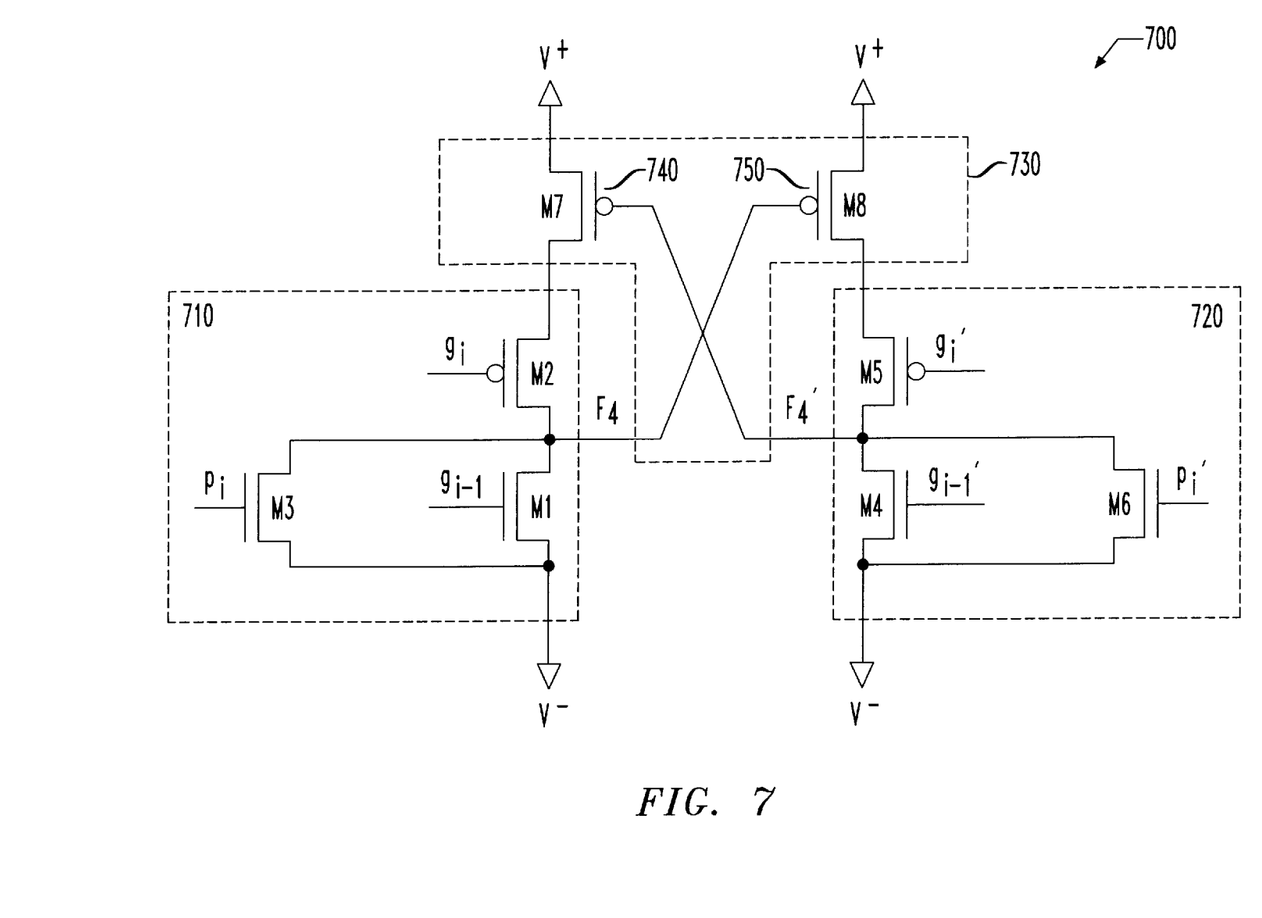
FIG. 7 illustrates a schematic diagram of another embodiment of a logic gate constructed in accordance with the principles of the present invention.

Turning now to FIG. 7, illustrated is a schematic diagram of another embodiment of a logic gate 700 constructed in accordance with the principles of the present invention. The logic gate 700 is configured to perform an $F_4$ function, which is described in more detail in the '811 application.

The logic gate 700 includes complementary first and second computational blocks 710, 720, and a cross-coupled differential load 730 coupled thereto. The cross-coupled differential load 730 includes a first load circuit 740 coupled to the first computational block 710 and a second load circuit 750 coupled to the second computational block 720.

The first computational block 710 has first, second and third binary inputs (first set of binary inputs) configured to receive corresponding first, second and third input binary digits (first set of input binary digits) $g_{i-1}$, $g_i$, $p_i$. The first, second and third binary inputs include first, second and third MOS transistors M1, M2, M3. The first, second and third input binary digits $g_{i-1}$, $g_i$, $p_i$ are applied to gates of the first, second and third MOS transistors M1, M2, M3, respectively. The first and third MOS transistors M1, M3 are NMOS transistors coupled to the negative voltage V$^-$, while the second MOS transistor M2 is a PMOS transistor coupled to the positive voltage V$^+$ (via the first load circuit 740).

The second computational block 720 has fourth, fifth and sixth binary inputs (second set of binary inputs) configured to receive corresponding fourth, fifth and sixth input binary digits (second set of input binary digits) $g_{i-1}'$, $g_i'$, $p_i'$. In the illustrated embodiment, ones of the second set of input binary digits are inverses of corresponding ones of the first set of input binary digits. The fourth, fifth and sixth binary inputs include fourth, fifth and sixth MOS transistors M4, M5, M6. The fourth, fifth and sixth input binary digits $g_{i-1}'$, $g_i'$, $p_i'$ are applied to gates of the fourth, fifth and sixth MOS transistors M4, M5, M6, respectively. The fourth and sixth MOS transistors M4, M6 are NMOS transistors coupled to the negative voltage V$^-$, while the fifth MOS transistor M5 is a PMOS transistor coupled to the positive voltage V$^+$ (via the second load circuit 750).

The first load circuit 740 includes a first load PMOS transistor M7 coupled between the second PMOS transistor M2 and the positive voltage V$^+$. The second load circuit 750 includes a second load PMOS transistor M8 coupled between the fifth PMOS transistor M5 and the positive voltage V$^+$.

The length and widths of the channels of each of the MOS transistors forming the first and second computational blocks 710, 720 and the first and second load circuits 740, 750 may be selected such that the intrinsic conductance of each of the MOS transistors corresponds to a desired discrete weight. In the illustrated embodiment, the first, second and third MOS transistors M1, M2, M3 are sized for discrete weights of about 1, 2 and 1, respectively. The first computational block 710, in combination with the first load circuit 740 may thus perform the following equation.

$$F_4 = \text{sgn}(2 \cdot g_i + 1 \cdot p_i + 1 \cdot g_{i-1} - 1.5) \quad (12)$$

The first and third MOS transistors M1, M3 are NMOS transistors and may each have dimensions of kλ and λ (microns), wherein k is a proportionality factor. The second MOS transistor M2 is a PMOS transistor and may have dimensions of 4kβλ and λ (microns), wherein β is a mobility factor.

The fourth, fifth and sixth MOS transistors M4, M5, M6 are also sized for discrete weights of about 1, 2 and 1, respectively. The fourth and sixth MOS transistors M4, M6 are NMOS transistors and may each have dimensions of kλ and λ (microns). The fifth MOS transistor M5 is a PMOS transistor and may have dimensions of 4kβλ and λ (microns).

The seventh and eighth MOS transistors M7, M8 are sized to provide threshold values of about 3–4 and about 2–3, respectively. The seventh and eighth MOS transistors M7, M8 are PMOS transistors. The seventh MOS transistor M7 may have dimensions of 3–4kβλ and λ (microns), while the eighth MOS transistor M8 may have dimensions of 2–3kβλ and λ (microns).

The first computational block 710 cooperates with the first load circuit 740 to develop the $F_4$ function, which may be represented by the following equation $$F_4 = \text{sgn}[\Sigma w_i x_i - \Theta(M2, M7)] \quad (13)$$

and applied to a control terminal of the second load circuit 750. The second and seventh MOS transistors M2, M7 are series-coupled and together provide a pull-up force to the parallel-coupled first and third MOS transistors M1, M3. The weight perceived by the first and third MOS transistors M1, M3 is, therefore, determined by the dimensions of both the second and the seventh MOS transistors M2, M7.

The second computational block 720 cooperates with the second load circuit 750 to develop a complement of the $F_4$ function, $F_4'$, which may be represented by the following equation $$F_4' = \text{sgn}[\Sigma v_i y_i - \Theta(M5, M8)] \quad (14)$$

and applied to a control terminal of the first load circuit 740. The fifth and eighth MOS transistors M5, M8 are series-coupled and together provide a pull-up force to the parallel-coupled fourth and sixth MOS transistors M4, M6. The weight perceived by the fourth and sixth MOS transistors M4, M6 is, therefore, determined by the dimensions of both the fifth and the eighth MOS transistors M5, M8.

The embodiment of the logic gate 700 illustrated and described is employable as part of an adder to generate an adder output bit from adder input bits. More specifically, the logic gate 700 receives carry-generate and carry-propagate bits ($g_{i-1}$, $g_i$, $p_i$) and generates therefrom the $F_4$ function representing a group carry-generate bit, which will be familiar to those skilled in the pertinent art.

Figure 8:
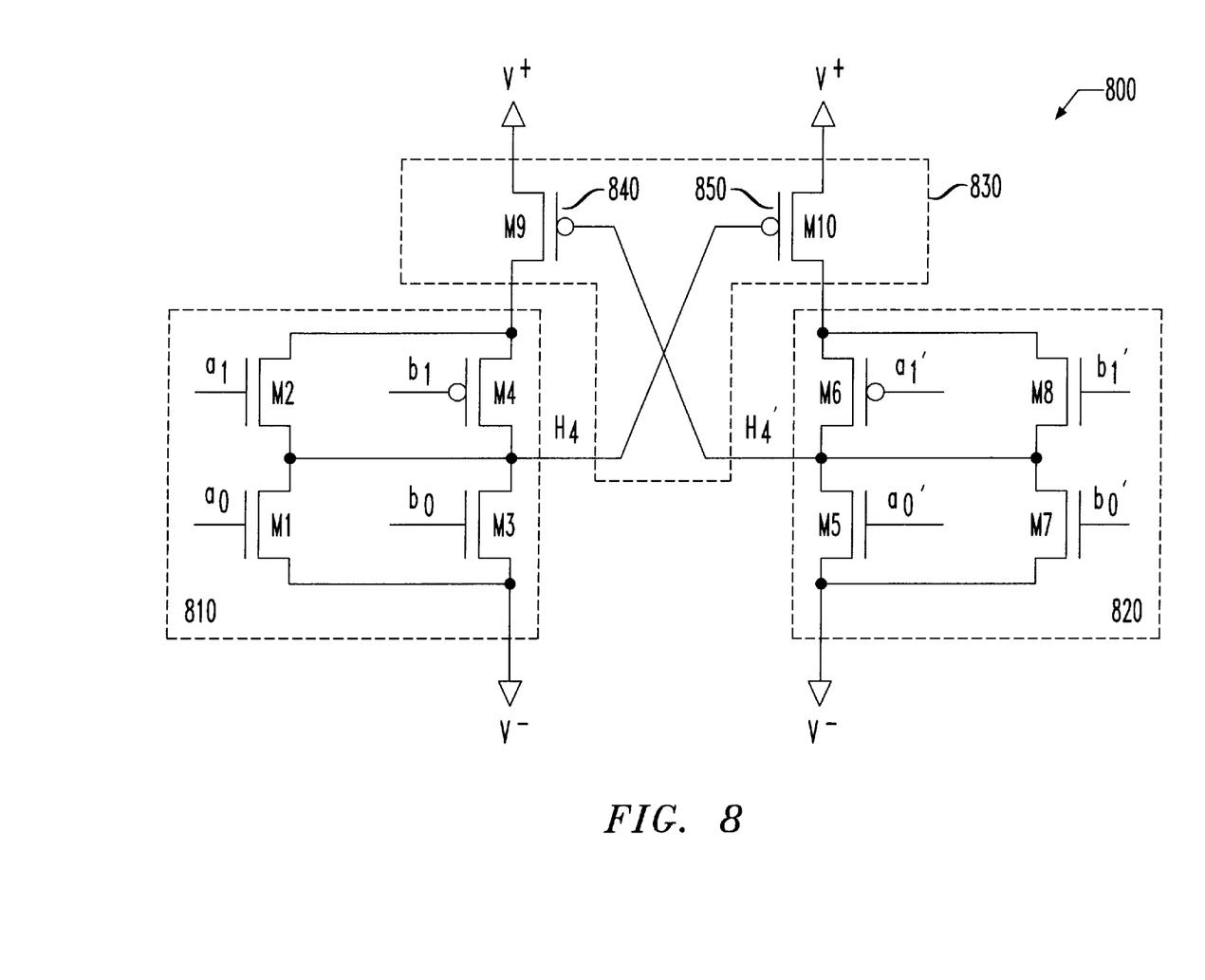
FIG. 8 illustrates a schematic diagram of yet another embodiment of a logic gate constructed in accordance with the principles of the present invention.

Turning now to FIG. 8, illustrated is a schematic diagram of yet another embodiment of a logic gate 800 constructed in accordance with the principles of the present invention. The logic gate 800 is configured to perform an $H_4$ function, which is described in more detail in the '367 application.

The logic gate 800 includes complementary first and second computational blocks 810, 820, and a cross-coupled differential load 830 coupled thereto. The cross-coupled differential load 830 includes a first load circuit 840 coupled to the first computational block 810 and a second load circuit 850 coupled to the second computational block 820.

The first computational block 810 has first, second, third and fourth binary inputs (first set of binary inputs) including first, second, third and fourth MOS transistors M1, M2, M3, M4 respectively configured to receive corresponding first, second, third and fourth input binary digits (first set of input binary digits) $a_0, a_1, b_0, b_1$. The first, second, third and fourth input binary digits $a_0, a_1, b_0, b_1$ are applied to gates of the first, second, third and fourth MOS transistors M1, M2, M3, M4 respectively. The first and third MOS transistors M1, M3 are NMOS transistors coupled to the negative voltage $V^-$, while the second and fourth MOS transistors M2, M4 are PMOS transistors coupled to the positive voltage $V^+$ (via the first load circuit 840).

The second computational block 720 has fifth, sixth, seventh and eighth binary inputs (second set of binary inputs) including fifth, sixth, seventh and eighth MOS transistors M5, M6, M7, M8 respectively configured to receive corresponding fifth, sixth, seventh and eighth input binary digits (second set of input binary digits) $a_0', a_1', b_0', b_1'$. In the illustrated embodiment, ones of the second set of input binary digits are inverses of corresponding ones of the first set of input binary digits. The fifth, sixth, seventh and eight input binary digits $a_0', a_1', b_0', b_1'$ are applied to gates of the fifth, sixth, seventh and eighth MOS transistors M5, M6, M7, M8 respectively. The fifth and seventh MOS transistors M5, M7 are NMOS transistors coupled to the negative voltage $V^-$, while the sixth and eighth MOS transistors M6, M8 are PMOS transistor coupled to the positive voltage $V^+$ (via the second load circuit 850).

The first load circuit 840 includes a first load PMOS transistor M9 coupled between the second and fourth PMOS transistors M2, M4 and the positive voltage $V^+$. The second load circuit 850 includes a second load PMOS transistor M10 coupled between the sixth and eighth PMOS transistors M6, M8 and the positive voltage $V^+$.

The length and widths of the channels of each of the MOS transistors forming the first and second computational blocks 810, 820 and the first and second load circuits 840, 850 may be selected such that the intrinsic conductance of each of the MOS transistors corresponds to a desired discrete weight. In the illustrated embodiment, the first, second, third and fourth MOS transistors M1, M2, M3, M4 are sized for discrete weights of about 1, 2, 1 and 2, respectively. The fifth, sixth, seventh and eighth MOS transistors M5, M6, M7, M8 are also sized for discrete weights of about 1, 2, 1 and 2, respectively. The ninth and tenth MOS transistors M9, M10 are sized to provide threshold values of about $\Theta(M9) \approx 3.5$ (e.g., 3–4) and about $\Theta(M10) \approx 2.5$ (e.g., 2–3), respectively.

The first computational block 810 cooperates with the first load circuit 840 to develop the $H_4$ function, represented by the following equation $$H_4 = \text{sgn}[2 \cdot a_1 + 2 \cdot b_1 + 1 \cdot a_0 + 1 \cdot b_0 - 3.5] \tag{15}$$

and applied to a control terminal of the second load circuit 750.

The second computational block 820 cooperates with the second load circuit 850 to develop a complementary $H_4'$ function, represented by the following equation $$H_4' = \text{sgn}[2 \cdot a_1' + 2 \cdot b_1' + 1 \cdot a_0' + 1 \cdot b_0' - 2.5] \tag{16}$$

and applied to a control terminal of the of the first load circuit 840. The first and second load circuits 840, 850 are thus cross-coupled to the first and second computational blocks 810, 820.

Although the present invention has been described in detail, those skilled in the art should understand that they can make various changes, substitutions and alterations herein without departing from the spirit and scope of the invention in its broadest form.

What is claimed is:

1. A logic gate, comprising:

complementary first and second computational blocks having first and second sets of binary inputs, respectively, said first computational block having a first set of transistors for said first set of binary inputs and sized to represent specific discrete weights, said first computation block employing said first set of transistors to develop an output binary digit that is a function of a weighted sum of a first set of input binary digits presented at said first set of binary inputs, said second computational block having a second set of transistors for said second set of binary inputs and sized to represent specific discrete weights, said second computational block employing said second set of transistors to develop a complementary output binary digit that is a function of a weighted sum of a second set of input binary digits presented at said second set of binary inputs; and a cross-coupled differential load, including:

a first load circuit comprising a first load transistor sized to represent a threshold value $\Theta(M1)$, said first load circuit coupled to said first computational block and driven by said complementary output binary digit, and a second load circuit comprising a second load transistor sized to represent a threshold value $\Theta(M2)$, said second load circuit coupled to said second computational block and driven by said output binary digit, at least one of said first set of transistors being sized differently from a corresponding one of said second set of transistors if said first load transistor is sized substantially identical to said second load transistor, each of said first set of transistors being sized substantially identical to corresponding ones of said second set of transistors if said first load transistor is sized differently from said second load transistor.

2. The logic gate as recited in claim 1 wherein said cross-coupled differential load cooperates with said first and second computational blocks to increase a noise tolerance of said logic gate.

3. The logic gate as recited in claim 1 wherein said logic gate computes said output binary digit and said complementary output binary digit without employing a timing signal.

4. The logic gate as recited in claim 1 wherein said first load circuit cooperates with said first computational block to implement a first threshold function.

5. The logic gate as recited in claim 4 wherein said output binary digit is further a function of said first threshold function.

6. The logic gate as recited in claim 1 wherein said second load circuit cooperates with said second computational block to implement a second threshold function.

7. The logic gate as recited in claim 6 wherein said complementary output binary digit is further a function of said second threshold function.

8. The logic gate as recited in claim 1 wherein said threshold values Θ(M1), Θ(M2) are a function of the relationship of Θ(M1)−Θ(M2)=1.

9. The logic gate as recited in claim 1 wherein said first and second computational blocks employ identical topologies.

10. The logic gate as recited in claim 1 wherein ones of said second set of input binary digits are inverses of corresponding ones of said first set of input binary digits.

11. The logic gate as recited in claim 1 wherein ones of said second set of input binary digits are identical to corresponding ones of said first set of input binary digits.

12. The logic gate as recited in claim 1 wherein said first and second computational blocks comprise n-channel metal oxide semiconductor (NMOS) transistors, each of said first and second load circuits comprising a p-channel metal oxide semiconductor (PMOS) transistor.

13. The logic gate as recited in claim 1 wherein said first and second computational blocks comprise p-channel metal oxide semiconductor (PMOS) transistors, each of said first and second load circuits comprising an n-channel metal oxide semiconductor (NMOS) transistor.

14. The logic gate as recited in claim 1 wherein said first and second computational blocks comprise one polarity of metal oxide semiconductor (MOS) transistor, each of said first and second load circuits comprising an identical polarity of MOS transistor and an inverter.

15. The logic gate as recited in claim 1 wherein each of said first and second computational blocks comprises at least one n-channel metal oxide semiconductor (MOS) and at least one p-channel metal oxide semiconductor (MOS) transistor.

16. The logic gate as recited in claim 1 wherein said first and second load circuits comprise elements selected from the group consisting of:
   p-channel metal oxide semiconductor (PNOS) transistors;
   n-channel metal oxide semiconductor (NMOS) transistors;
   PMOS transistors having inverters coupled thereto;
   NMOS transistors having inverters coupled thereto; and
   an NMOS transistor, a PMOS transistor and an inverter.

17. A method of performing a logic operation, comprising:
   receiving, in a first computational block, a first set of input binary digits presented at a first set of binary inputs of said first computational block, said first computational block having a first set of transistors for said first set of binary inputs and sized to represent specific discrete weights;
   receiving, in a second computational block, a second set of input binary digits presented at a second set of binary inputs of said second computational block, said second computational block having a second set of transistors for said second set of binary inputs and sized to represent specific discrete weights;
   developing an output binary digit that is a function of a weighted sum of said first set of input binary digits;
   developing a complementary output binary digit that is a function of a weighted sum of said second set of input binary digits;
   driving a first load circuit of a cross-coupled differential load with said complementary output binary digit, said first load circuit including a first load transistor sized to represent a threshold value Θ(M1); and
   driving a second load circuit of said cross-coupled differential load with said output binary digit, said second load circuit including a second load transistor sized to represent a threshold value Θ(M2), at least one of said first set of transistors being sized differently from a corresponding one of said second set of transistors if said first load transistor is sized substantially identical to said second load transistor, each of said first set of transistors being sized substantially identical to corresponding ones of said second set of transistors if said first load transistor is sized differently from said second load transistor.

18. The method as recited in claim 17 further comprising increasing a noise tolerance of said logic gate.

19. The method as recited in claim 17 wherein said developing said output binary digit and said developing said complementary output binary digit are performed without employing a timing signal.

20. The method as recited in claim 17 further comprising performing a first threshold function with said first load circuit and said first computational block.

21. The method as recited in claim 20 wherein said output binary digit is further a function of said first threshold function.

22. The method as recited in claim 17 further comprising performing a second threshold function with said second load circuit and said second computational block.

23. The method as recited in claim 22 wherein said complementary output binary digit is further a function of said second threshold function.

24. The method as recited in claim 17 wherein said threshold values Θ(M1), Θ(M2) are a function of the relationship of Θ(M1)−Θ(M2)=1.

25. The method as recited in claim 17 wherein said first and second computational blocks employ identical topologies.

26. The method as recited in claim 17 wherein ones of said second set of input binary digits are inverses of corresponding ones of said first set of input binary digits.

27. The method as recited in claim 17 wherein ones of said second set of input binary digits are identical to corresponding ones of said first set of input binary digits.

28. The method as recited in claim 17 wherein said first and second computational blocks comprise n-channel metal oxide semiconductor (NMOS) transistors, each of said first and second load circuits comprising a p-channel metal oxide semiconductor (PMOS) transistor.

29. The method as recited in claim 17 wherein said first and second computational blocks comprise p-channel metal oxide semiconductor (PMOS) transistors, each of said first and second load circuits comprising an n-channel metal oxide semiconductor (NMOS) transistor.

30. The method as recited in claim 17 wherein said first and second computational blocks comprise one polarity of metal oxide semiconductor (MOS) transistor, each of said first and second load circuits comprising an identical polarity of MOS transistor and an inverter.

31. The method as recited in claim 17 wherein each of said first and second computational blocks comprises at least one n-channel metal oxide semiconductor (MOS) and at least one p-channel metal oxide semiconductor (MOS) transistor.

32. The method as recited in claim 17 wherein said first and second load circuits comprise elements selected from the group consisting of:
   p-channel metal oxide semiconductor (PMOS) transistors;
   n-channel metal oxide semiconductor (NMOS) transistors;

PMOS transistors having inverters coupled thereto;
NMOS transistors having inverters coupled thereto; and
an NMOS transistor, a PMOS transistor and an inverter.

33. A method of manufacturing a logic gate, comprising:
providing a first computational block having a first set of binary inputs and a first set of transistors for said first set of binary inputs, said first set of transistors sized to represent specific discrete weights, said first computational block configured to develop an output binary digit that is a function of a weighted sum of a first set of input binary digits presented at said first set of binary inputs;

providing a second computational block having a second set of binary inputs and a second set of transistors for said second set of binary inputs, said second set of transistors sized to represent specific discrete weights, said second computational block configured to develop a complementary output binary digit that is a function of a weighted sum of a second set of input binary digits presented at said second set of binary inputs;

coupling a first load circuit of a cross-coupled differential load to said first computational block, said first load circuit driven by said complementary output binary digit and including a first load transistor sized to represent a threshold value $\Theta(M1)$;

coupling a second load circuit of said cross-coupled differential load to said second computational block, said second load circuit driven by said output binary digit and including a second load transistor sized to represent a threshold value $\Theta(M2)$; and sizing at least one of said first set of transistors differently from a corresponding one of said second set of transistors if said first load transistor is sized substantially identical to said second load transistor, sizing each of said first set of transistors substantially identical to corresponding ones of said second set of transistors if said first load transistor is sized differently from said second load transistor.

34. The method as recited in claim 33 wherein said cross-coupled differential load cooperates with said first and second computational blocks to increase a noise tolerance of said logic gate.

35. The method as recited in claim 33 wherein said logic gate computes said output binary digit and said complementary output binary digit without employing a timing signal.

36. The method as recited in claim 33 wherein said first load circuit cooperates with said first computational block to implement a first threshold function.

37. The method as recited in claim 36 wherein said output binary digit is further a function of said first threshold function.

38. The method as recited in claim 33 wherein said second load circuit cooperates with said second computational block to implement a second threshold function.

39. The method as recited in claim 38 wherein said complementary output binary digit is further a function of said second threshold function.

40. The method as recited in claim 33 wherein said coupling said first load circuit comprises coupling said first load transistor to said first computational block and said coupling said second load circuit comprises coupling said second load transistor to said second computational block.

41. The method as recited in claim 40 wherein said threshold values $\Theta(M1)$, $\Theta(M2)$ are a function of the relationship of $\Theta(M1)-\Theta(M2)=1$.

42. The method as recited in claim 33 wherein said first and second computational blocks employ identical topologies.

43. The method as recited in claim 33 wherein ones of said second set of input binary digits are inverses of corresponding ones of said first set of input binary digits.

44. The method as recited in claim 33 wherein ones of said second set of input binary digits are identical to corresponding ones of said first set of input binary digits.

45. The method as recited in claim 33 wherein said first and second computational blocks comprise n-channel metal oxide semiconductor (NMOS) transistors, each of said first and second load circuits comprising a p-channel metal oxide semiconductor (PMOS) transistor.

46. The method as recited in claim 33 wherein said first and second computational blocks comprise p-channel metal oxide semiconductor (PMOS) transistors, each of said first and second load circuits comprising an n-channel metal oxide semiconductor (NMOS) transistor.

47. The method as recited in claim 33 wherein said first and second computational blocks comprise one polarity of metal oxide semiconductor (MOS) transistor, each of said first and second load circuits comprising an identical polarity of MOS transistor and an inverter.

48. The method as recited in claim 33 wherein each of said first and second computational blocks comprises at least one n-channel metal oxide semiconductor (MOS) and at least one p-channel metal oxide semiconductor (MOS) transistor.

49. The method as recited in claim 33 wherein said first and second load circuits comprise elements selected from the group consisting of:
p-channel metal oxide semiconductor (PMOS) transistors;
n-channel metal oxide semiconductor (NMOS) transistors;
PMOS transistors having inverters coupled thereto;
NMOS transistors having inverters coupled thereto; and
an NMOS transistor, a PMOS transistor and an inverter.

* * * * *